(12) United States Patent
Yu et al.

(10) Patent No.: US 7,988,246 B2
(45) Date of Patent: Aug. 2, 2011

(54) MOUNTING APPARATUS FOR SLIDE RAIL

(75) Inventors: Mo-Ming Yu, Shenzhen (CN);
Hai-Chen Zhou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 494 days.

(21) Appl. No.: 12/248,902

(22) Filed: Oct. 10, 2008

(65) Prior Publication Data
US 2009/0309471 A1 Dec. 17, 2009

(30) Foreign Application Priority Data

Jun. 16, 2008 (CN) .......................... 2008 1 0302157

(51) Int. Cl.
A47B 88/00 (2006.01)
(52) U.S. Cl. .................... 312/334.4; 312/265.4; 211/26; 211/175
(58) Field of Classification Search .............. 312/334.4, 312/334.1, 334.5, 334.6, 334.7, 334.8, 334.44, 312/223.1, 223.2, 265.4; 211/26, 175, 191, 211/192, 182
See application file for complete search history.

(56) References Cited

U.S. PATENT DOCUMENTS

| | | | | |
|---|---|---|---|---|
| 6,666,340 B2 * | 12/2003 | Basinger et al. | ................ | 211/26 |
| 6,840,388 B2 * | 1/2005 | Mayer | ............................. | 211/26 |
| 7,552,899 B2 * | 6/2009 | Chen et al. | ................ | 248/224.8 |
| 7,740,329 B2 * | 6/2010 | Hsiung et al. | ............. | 312/334.4 |

* cited by examiner

*Primary Examiner* — Korie Chan
(74) *Attorney, Agent, or Firm* — Zhigang Ma

(57) ABSTRACT

A mounting apparatus is provided for mounting a slide rail to a fixed structure includes a mounting bracket fixed to the slide rail, an actuating member slidably attached to the mounting bracket, at least one blocking member extending from the actuating member, a locking member deformably attached to the mounting bracket, and a resilient member connecting between the mounting bracket and the actuating member. The actuating member is slidable between a first position to maintain securing of the mounting bracket to the support, and a second position to allow release the mounting bracket from the support. The locking member comprises at least one first abutting end releasably abutting the blocking member to maintain the actuating member in the first position, and at least one second abutting end releasably abutting the blocking member to maintain the actuating member in the second position. The resilient member biases the actuating member to the first portion.

10 Claims, 4 Drawing Sheets

MOUNTING APPARATUS FOR SLIDE RAIL

BACKGROUND

1. Field of the Invention

The disclosure relates to hardware mounting, and more particularly to a mounting apparatus for a slide rail.

2. Description of Related Art

Traditionally, slide rails are used to removably mount elements on larger stationary elements, such as a desk and a drawer, a server and a rack, etc.

A conventional slide rail assembly for a drawer and a desk includes an outer slide rail mounted to the desk, an inner slide rail mounted to the drawer, and an intermediate slide rail mounted between the outer and inner slide rails. The intermediate slide rail is extendable relative to the outer slide rail, and the inner slide rail is extendable relative to the intermediate slide rail, thus the drawer can be extended a distance out from the desk. A plurality of screws mounting the outer slide rail to a bracket of the desk renders installation and removal of the outer slide rail to/from the bracket inconvenient and time-consuming.

DETAILED DESCRIPTION

Figure 1:
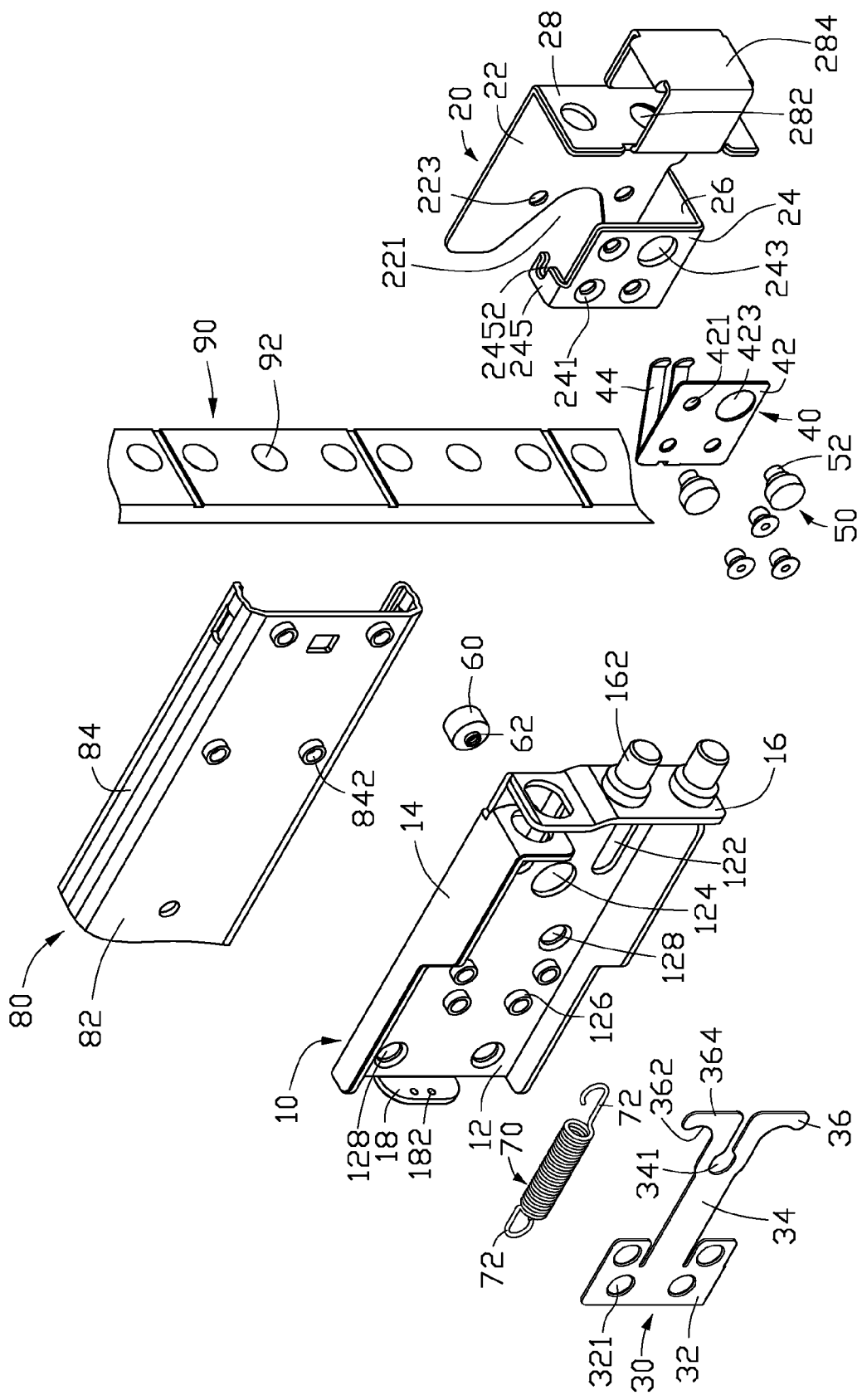
FIG. 1 is an exploded, isometric view of a mounting apparatus according to an exemplary embodiment, together with a support.
Figure 2:
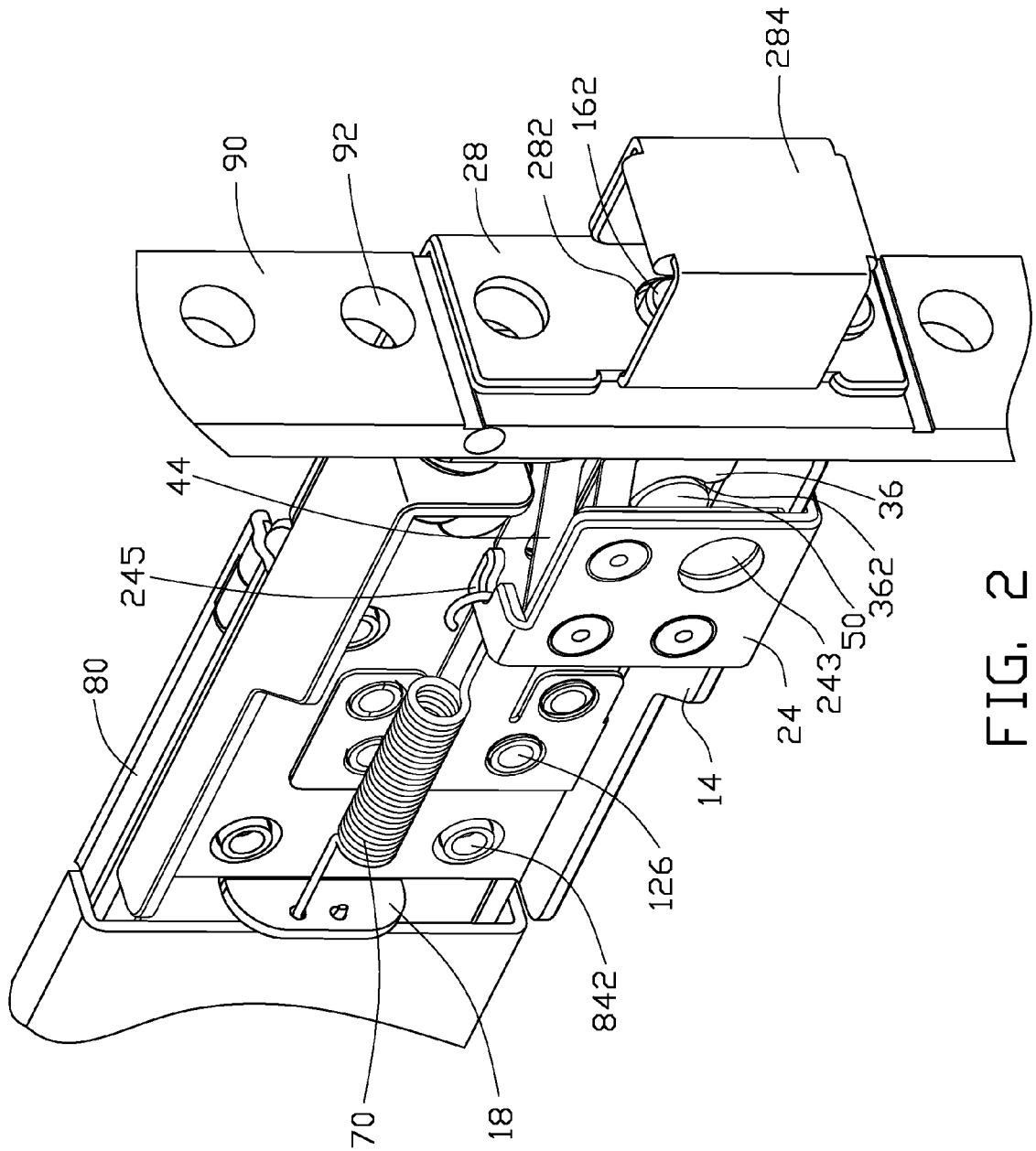
FIG. 2 is an assembled, isometric view of the mounting apparatus of FIG. 1.

Referring to FIGS. 1 and 2, in an exemplary embodiment, a mounting apparatus is provided for mounting a slide rail 80 to a support 90 of an electronic equipment cabinet. The mounting apparatus includes a mounting bracket 10, an actuating member 20, a locking member 30, a pressing member 40, a pair of blocking members 50, a button 60, and a resilient member 70.

The slide rail 80 defines a substantially C-shaped cross section, and includes a base wall 82 with two flanges 84 extending from opposite inner sides thereof. The base wall 82 forms a plurality of protrusions 842 extending from an outer side thereof.

The support 90 includes a plurality of spaced through holes 92 defined therein, arranged from top to bottom.

The mounting bracket 10 includes a sidewall 12, two flanges 14 perpendicularly extending from opposite sides of the sidewall 12, and an end wall 16 and a tab 18 extending from opposite ends of the sidewall 12. A pair of parallel guide slots 122, a through hole 124, and a plurality of fixing holes 128 are defined in the sidewall 12. The sidewall 12 further forms a plurality of protrusions 126 surrounded by the fixing holes 128. The through hole 124 is located between the guide slots 122 and arranged near ends of the guide slots 122 opposite to end wall 16. Two posts 162 extend from an outer side of the end wall 16 counter to the tab 18. The tab 18 defines two engaging holes 182 therein.

The actuating member 20 includes a first side panel 22, a second side panel 24 parallel thereto, a bottom panel 26 perpendicularly connected to bottom edges of the first side panel 22 and the second side panel 24, and a limiting panel 28 perpendicularly extending from a first end of the first side panel 22 toward the second side panel 24. The first side panel 22 defines a V-shaped opening 221 in a second end thereof, and a pair of positioning holes 223 near opposite sides of the opening 221, respectively. The second side panel 24 defines a plurality of positioning holes 241 and an interference prevention hole 243 therein. An engaging portion 245 extends from a top edge of the second side panel 24 and defines a notch 2452 therein. The limiting panel 28 defines two through holes 282 therein. A U-shaped operating portion 284 is formed at an outer side surface of the limiting panel 28.

In the present embodiment, the locking member 30 is a resilient metal plate. The locking member 30 includes a mounting portion 32, an arm 34 extending from the mounting portion 32, and a pair of opposite L-shaped locking portions 36 extending from a distal end of the arm 34. The mounting portion 32 defines a plurality of fixing holes 321 corresponding to the protrusions 126 of the mounting bracket 10. A bonding hole 341 is defined in the arm 34 between the two locking portions 36. Each locking portion 36 includes a curved first abutting end 362, and a straight second abutting end 364, located at two opposite sides of a distal end portion thereof.

The pressing member 40 includes a locating wall 42 and two resisting portions 44 angling from an edge of the locating wall 42. A pair of fixing holes 421 and a limiting hole 423 are defined in the locating wall 42.

Each blocking member 50 is a stepped cylinder and includes a shank 52 extending from an end thereof.

The button 60 includes a fixing portion 62 extending from an end thereof.

In the present embodiment, the resilient member 70 is a coil spring with hooks extending from two opposite ends thereof.

Figure 3:
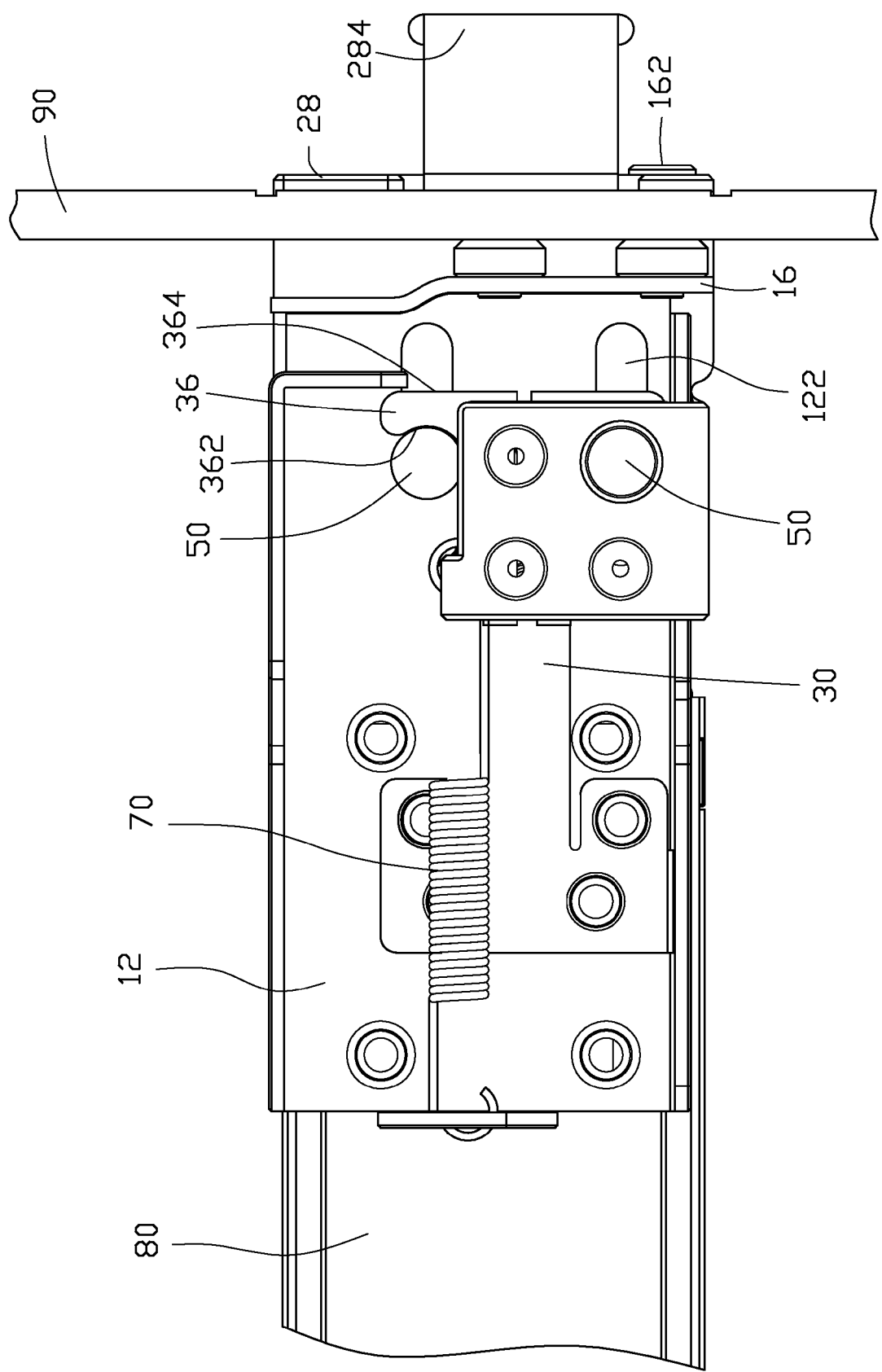
FIG. 3 is a side plan view of FIG. 2, with the mounting bracket in a secured state.
Figure 4:
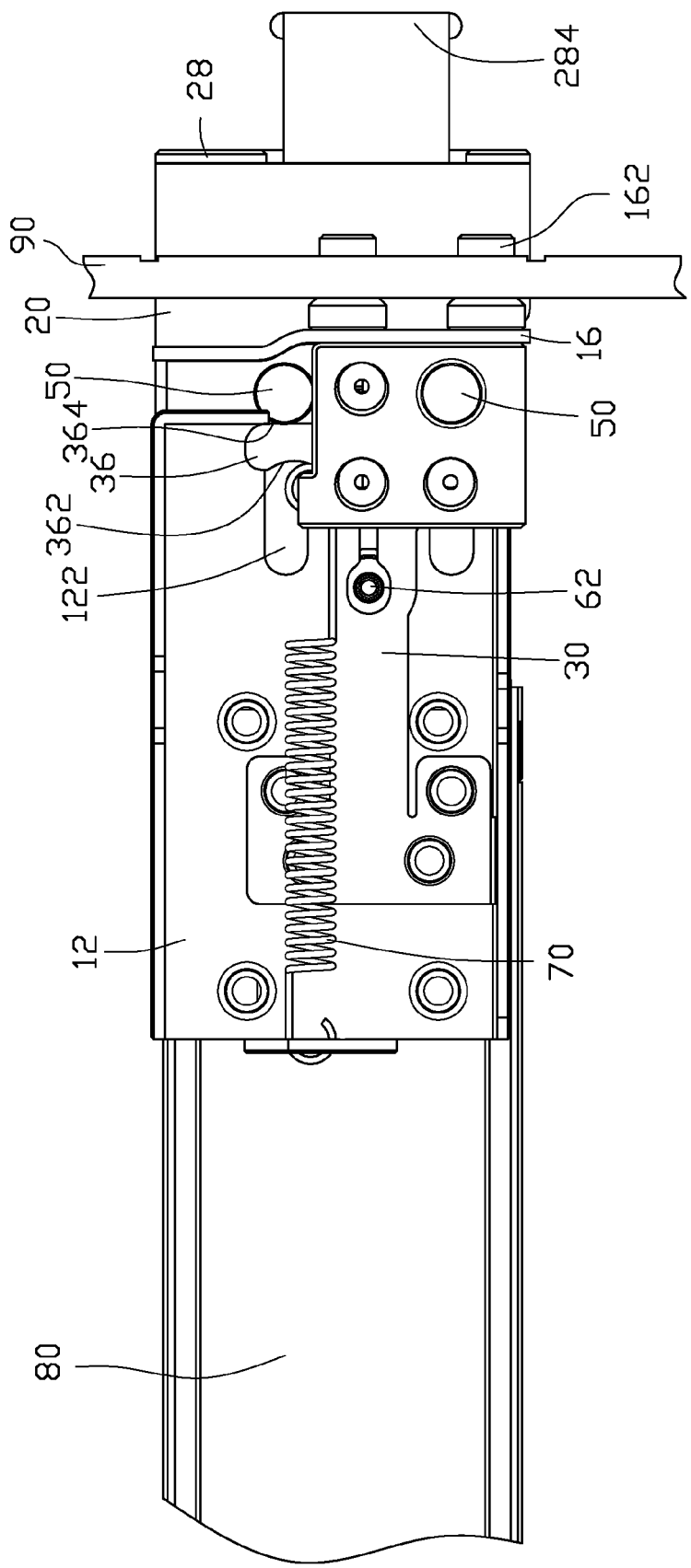
FIG. 4 is another side plan view of FIG. 2, with the mounting bracket in a released state.

Referring also to FIGS. 2 to 4, in assembly of the mounting apparatus, the button 60 is attached to the locking member 30, with the fixing portion 62 secured in the binding hole 341. The locking member 30 is attached to the sidewall 12 of the mounting bracket 10, with the protrusions 126 fixed in the fixing holes 321, the button 60 extending through the through hole 124, and the locking portions 36 shielding the guide slots 122. The pressing member 40 is attached to an inside of the second side panel 24 of the actuating member 20, with a plurality of rivets correspondingly fixed in the positioning holes 241 of the second side plate 24 and the fixing holes 421 of the locating wall 42, and the interference prevention hole 243 aligning with the limiting hole 423. The mounting bracket 10 moves between the first side panel 22 and the second side panel 24 of the actuating member 20. The first side panel 22 and the bottom panel 26 of the actuating member 20 abut the sidewall 12 and a lower flange 14 of the mounting bracket 10. The posts 16 slidably extend into the through holes 282 of limiting plate 28 of the mounting bracket 10. The resisting portions 44 of the pressing member 40 resist against one of the locking portions 36 of the locking member 30. The button 60 is received in the opening 221 of the actuating member 20. The shanks 52 of the blocking members 50 respectively extend through the guide slots 122 of the mounting bracket 10 to be fixed in the positioning holes 223 of the actuating member 20. The blocking members 50 abut the first abutting ends 362 of the locking member 30. One of the blocking members 50 extends through the interference prevention holes 243, 423, for convenient installation. The hooks 72 of the resilient member 70 are respectively engaged in the notch 2452 of the actuating member 20 and the engaging holes 182 of the tab 18 of the mounting bracket 10.

The mounting apparatus is attached to the slide rail 80, with the protrusions 842 fixed in the fixing holes 128 of the mounting bracket 10.

Referring also to FIG. 4, before mounting the slide rail 80 to the support 90, the button 60 is pressed to move the locking portions 36 away from the sidewall 12, and the resisting portions 44 of the pressing member 40 are deformed so that the blocking members 50 disengage from the first abutting ends 362 of the locking portions 36. The actuating member 20 is moved away from the mounting bracket 10 via the operating portion 24, with the blocking members 50 sliding in the guide slots 122 and the resilient member 70 extending. Button 60 is released, and the locking portions 36 of the locking member 30 and the resisting portion 44 of the pressing member 40 are restored. Thus, the second abutting ends 364 of the locking portions 36 abut the blocking member 50 to maintain the limiting plate 28 of the actuating member 20 a certain distance from the end wall 16 of the mounting bracket 10. The posts 162 are withdrawn from the through holes 282.

Referring also to FIG. 3, to mount the slide rail 80 to the support 90, the support 90 is sandwiched between the limiting plate 28 of the actuating member 20 and the end wall 16 of the mounting bracket 10, with the posts 162 extending into the through holes 92 of support 90. The button 60 is pressed to move the locking portions 36 away from the sidewall 12 to release the blocking member 50 from the second abutting end 364 of the locking portions 36. The resilient member 70 is restored to move the actuating member 20 to its original position. At the same time, the limiting plate 28 of the actuating member 20 slides towards the end wall 16 of the support 90 until the limiting plate 28 abuts the support 90, with the blocking members 50 moving in the guide slots 122. The posts 162 further extend into the through holes 282 of the limiting plate 28. The button 60 is released so that the locking portions 36 of the locking member 30 are restored and the first abutting ends 362 abut the blocking members 50, to prevent the posts 162 from exiting the through holes 92 of the support 90. The slide rail 80 is thus securely coupled to the support 90.

Referring also to FIG. 4, when the slide rail 80 is to be detached from the support 90, the button 60 releases the blocking member 50 from the locking portions 36 of the locking member 30 and moves the actuating member 20 away from the support 90. The slide rail 80, together with the mounting apparatus, is thus easily detached from the support 90.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a slide rail to a fixed structure, the mounting apparatus comprising:
    a mounting bracket fixed to the slide rail;
    an actuating member slidably attached to the mounting bracket and slidable between a first position securing the mounting bracket to the support, and a second position releasing the mounting bracket from the support;
    at least one blocking member extending from the actuating member and slidable with the actuating member;
    a locking member deformably attached to the mounting bracket and comprising at least one first abutting end releasably abutting the blocking member to maintain the actuating member in the first position, and at least one second abutting end releasably abutting the blocking member to maintain the actuating member in the second position; and
    a resilient member connecting the mounting bracket and the actuating member, and biasing the actuating member to the first position.

2. The mounting apparatus as described in claim 1, wherein the mounting bracket comprises an end wall and at least one post extending from the end wall; the actuating member comprises a limiting plate; in the first position, the post of the mounting bracket extends into a through hole of the support from a first side of the support, and the limiting plate of the actuating member abuts the support at a second side thereof opposite to the first side.

3. The mounting apparatus as described in claim 2, wherein the limiting plate defines at least one through hole aligned with the through hole of the support to receive the post.

4. The mounting apparatus as described in claim 1, wherein the resilient member is a coil spring with two hooks formed at opposite ends thereof, the two hooks are respectively configured to engage with the mounting bracket and the actuating member.

5. The mounting apparatus as described in claim 1, wherein the locking member is a resilient metal plate.

6. The mounting apparatus as described in claim 5, wherein the locking member comprises a mounting portion fixed to the mounting bracket, and at least one locking portion extending from the mounting portion, with the first and the second abutting ends formed in the locking portion.

7. The mounting apparatus as described in claim 1, wherein the mounting bracket defines a guide slot in which the blocking member slides.

8. The mounting apparatus as described in claim 6, further comprising a button attached to the locking member near the locking portion.

9. The mounting apparatus as described in claim 1, further comprising a pressing member attached to the actuating member, wherein the pressing member comprises at least one resisting portion pressing the locking member on the mounting bracket.

10. The mounting apparatus as described in claim 2, wherein the actuating member further comprises an operating portion extending from the limiting plate.

* * * * *